United States Patent [19]
Po et al.

[11] Patent Number: 5,268,978
[45] Date of Patent: Dec. 7, 1993

[54] OPTICAL FIBER LASER AND GEOMETRIC COUPLER

[75] Inventors: Hong Po, Sherborn; Stephen D. Fantone, Lynnfield, both of Mass.

[73] Assignee: Polaroid Corporation, Cambridge, Mass.

[21] Appl. No.: 994,412

[22] Filed: Dec. 18, 1992

[51] Int. Cl.$^5$ .................... G02B 6/32; H01S 3/094
[52] U.S. Cl. .................... 385/33; 385/34; 385/89; 385/119; 385/121; 372/6; 372/70; 372/71
[58] Field of Search .................... 385/33, 34, 35, 88, 385/89, 93, 115, 119, 121, 147; 372/6, 69, 70, 71

[56] References Cited

U.S. PATENT DOCUMENTS

| | | | |
|---|---|---|---|
| 3,808,549 | 4/1974 | Maurer | 372/6 |
| 4,185,891 | 1/1980 | Kaestner | 372/9 |
| 4,383,318 | 5/1983 | Barry et al. | 372/6 |
| 4,479,224 | 10/1984 | Rediker | 372/92 |
| 4,637,685 | 1/1987 | Gordon | 385/89 |
| 4,713,822 | 12/1987 | Lee | 372/69 |
| 4,730,198 | 3/1988 | Brown et al. | 385/89 |
| 4,815,079 | 3/1989 | Snitzer et al. | 372/6 |
| 4,818,062 | 4/1989 | Scifres et al. | 385/33 |
| 4,826,269 | 5/1989 | Streifer et al. | 359/19 |
| 4,948,214 | 8/1990 | Hamblen | 385/33 |
| 4,972,427 | 11/1990 | Streifer et al. | 372/92 |
| 4,974,927 | 12/1990 | Kimura | 385/33 |
| 5,027,359 | 6/1991 | Leger et al. | 372/18 |
| 5,058,980 | 10/1991 | Howerton | 372/70 |
| 5,081,639 | 1/1992 | Snyder et al. | 372/101 |
| 5,093,879 | 3/1992 | Bregman et al. | 385/93 |
| 5,127,068 | 6/1992 | Baer et al. | 385/34 |
| 5,182,782 | 1/1993 | Tabasky et al. | 385/89 |
| 5,185,758 | 2/1993 | Fan et al. | 372/72 |
| 5,204,927 | 4/1993 | Chin et al. | 385/121 |

OTHER PUBLICATIONS

IBM Technical Disclosure Bulletin, vol. 19, No. 2, Jul. 1976, "Collimated Light Source With Laser Diode and Microcylindrical Lens," E. A. Cunningham.

*Primary Examiner*—Frank Gonzalez
*Attorney, Agent, or Firm*—Francis J. Caufield

[57] ABSTRACT

In an optical coupling system for a fiber laser, a cylindrical lens extends parallel to a number of aligned light sources and a series of aligned input ends of optical fibers facing the light sources. Output ends of the fibers pass light to a solid state medium in a laser cavity. A block with precision grooves holds the fibers to align them with the lens and the images of the light sources. The cylindrical lens is biaspheric with a longitudinal axis and two refractive surfaces whose axially transverse cross-sections follow paths other than the paths of a conic section.

24 Claims, 3 Drawing Sheets

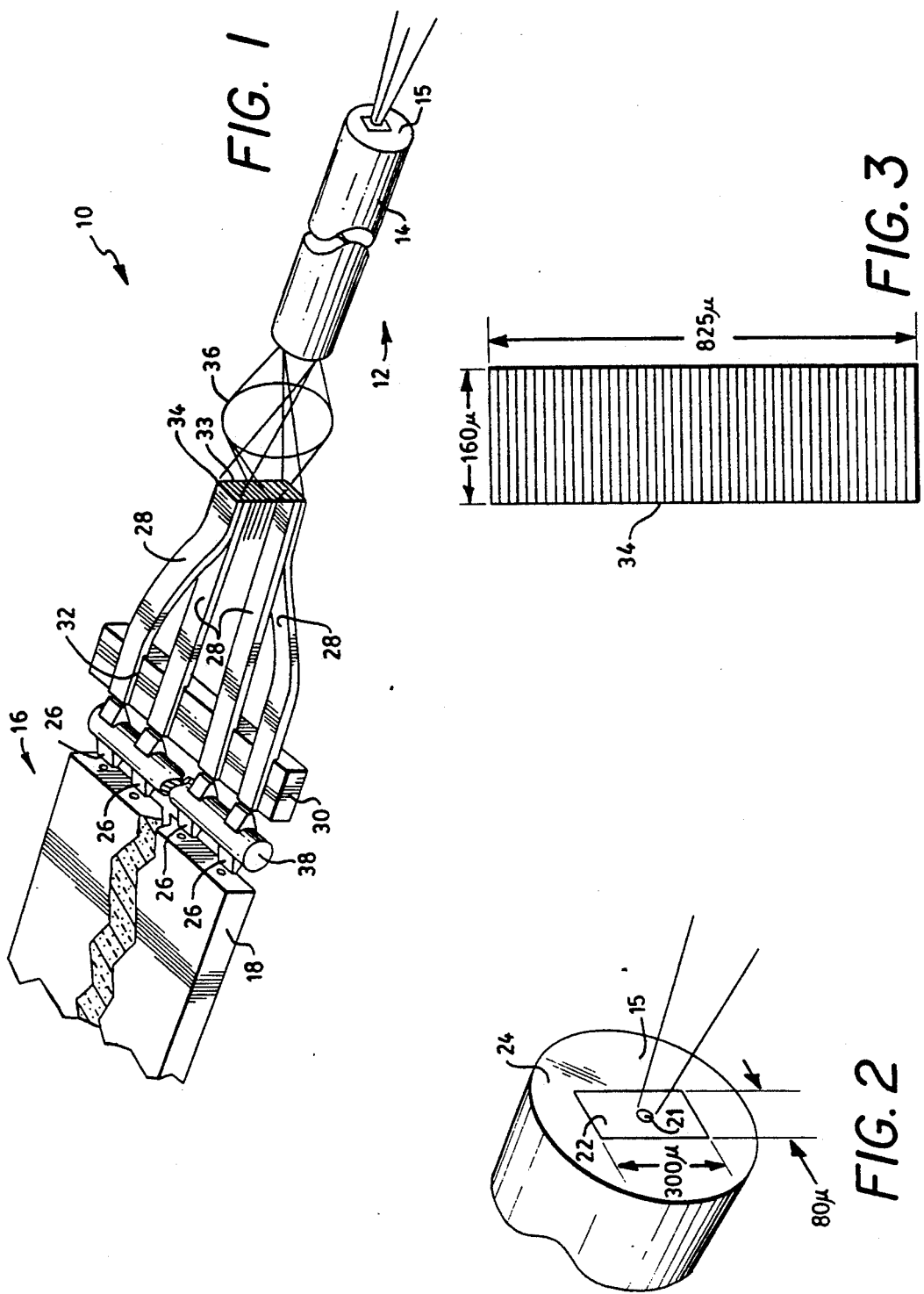

OPTICAL FIBER LASER AND GEOMETRIC COUPLER

CROSS REFERENCE TO RELATED APPLICATIONS

This application is related to the concurrently filed U.S. patent application Ser. No. 07/993,653 of Stephen D. Fantone entitled "Cylindrical Fiber Coupling Lens With Biaspheric Surfaces and Fabrication Method Thereof" commonly assigned herewith (still pending) and to U.S. Pat. No. 5,204,927 of Aland K Chin, et al. entitled "Fiber Coupler and Method and Apparatus For Making Same". The contents of the concurrently filed Fantone application is hereby incorporated into and made a part of this application as if fully recited herein.

BACKGROUND OF THE INVENTION

1. Field of the Invention

This invention relates to fiber lasers, and particularly to methods and means for coupling radiation into the core of a fiber laser oscillator or optical fiber laser amplifier.

2. Description of the Prior Art

Fiber lasers are useful in printers to form images by exposing a medium while scanning it. Such media may, for example, be of the thermally sensitive type that exhibits a binary response, one requiring that a threshold level of energy be exceeded for image formation purposes. Such fiber lasers are often pumped by radiant sources which deliver radiation to the active material in the fiber's core, which serves as the lasing cavity. For optimal performance in such devices, it is desirable to make the most efficient use of available pump power.

U.S. Pat. No. 4,815,079 discloses an optical fiber laser in which radiation is pumped into a single mode core of a laser cavity via a double clad fiber coupling arrangement. Here, a first multimode layer surrounds a single mode core, and it, in turn, is surrounded by a second outermost layer. The multimode layer is a core with respect to the outermost layer which serves as a cladding. At the same time, the multimode layer is a cladding with respect to the single mode, innermost, core. Pump light coupled into the first multimode cladding, either through its end facet or its side, propagates along its length, undergoing a multiplicity of reflections at its core cladding interface, while intersecting and being absorbed by the innermost core to cause lasing action and/or amplification. In one type of fiber laser the multimode waveguide or cladding takes the form a rectangular slab that extends along the laser length.

Fiber lasers are usually made fairly long, on the order of thirty meters or so, with small cross-sectional geometries to make them easy to coil into compact configurations and prevent concentration quenching. However, these qualities, while advantageous for a variety of reasons, make it extremely difficult to efficiently couple high pump power into them to promote lasing action, particularly where printing applications demand high power. Those skilled in the art have addressed the foregoing problem with more or less success in a variety of ways.

For example, U.S. Pat. No. 4,818,062 discloses a fiber laser with a bundle of waveguides that receive light from a bar of diode laser elements and couple their outputs into a solid state laser medium through a lens. While such an arrangement is adequate for solid state lasers having entrance facets with dimensions of several millimeters, it is more difficult to achieve efficient coupling of high power from the waveguide bundle into the much smaller entrance ends of long, thin, low loss, single-mode fiber lasers with multi-mode claddings. Another disadvantage of this arrangement lies in the difficulty one encounters in matching the lateral and transverse numerical apertures of the waveguides with the lateral and transverse divergences of the laser elements.

U.S. Pat. No. 5,127,068 discloses a cylindrical microlens for collimating the high numerical aperture (NA) output emissions of laser diode arrays so that it may be coupled into an optical fiber. The microlens has a diameter roughly equal to the diameter of the fibers and 20% to 50% bigger than the lateral dimension of the laser diode array. The patent mentions that cross-sectional shapes such as elliptical or hyperbolic may prove useful for correction of particular spherical aberrations. Such an arrangement requires a precisely small spacing from the microlens to the optical fibers creating a crowded condition in which unintended contact and damage to the microlens or fibers may occur. Moreover, positional and alignment errors may prevent matching of the numerical apertures of the fibers with the divergences of the laser diodes thus tending to reduce coupling efficiency.

U.S. Pat. No. 5,081,639 discloses a cylindrical microlens which produces focused, defocused, or collimated exiting light and having circular, elliptical, and hyperbolic cross-sectional shapes. Such lenses are well-corrected on axis but rapidly lose correction off-axis. Thus, they have limited practical ability to couple light simply and efficiently from laser diodes into fiber waveguides.

U.S. Pat. No. 4,826,269 discloses focusing diode lasers onto a single region by circularly disposing a number of vertical and horizontal cylindrical lenses. The complexity of such a device makes it unsuitable for many applications.

In as much as there continues to be a need for high power optical fiber lasers, it is a primary object of the present invention to provide such devices.

Another object is to provide an improved coupling system for pumping a solid state medium of a fiber laser cavity.

Other objects of the invention will be apparent, in part, and, in part, will become obvious when reading the following detailed description in conjunction with the drawings.

SUMMARY OF THE INVENTION

A single source fiber laser and geometric coupler having an output of 5 watts with an NA~0.15 at $\lambda = 1.06\mu$ is disclosed thus making it highly desirable for, among other things, printing applications.

The laser comprises three major components: a laser cavity in the form of a specially configured optical fiber with appropriate feedback, a light source in the form of a modulatable semiconductor laser diode array, and the geometric coupling system for collecting energy from the laser diode array and introducing it into the laser cavity for pumping purposes.

The optical fiber comprises a single mode core that is doped with a lasing species such as a rare earth. For the $1.06\mu$ wavelength, the rare earth comprises neodymium, $Nd^{3+}$ ions present in concentrations of $\frac{1}{4}$ weight percent or higher. However, other suitable dopants such as Er-Yb and Yb are also well within the scope of the invention.

The single mode is surrounded by a first cladding that is elongated, preferably in the form of a rectangular, but is not necessarily so, provided it is longer in one dimension. The rectangular cladding, in turn, is surrounded by a second cladding preferably made of a low index fluorinated polymer. The index of refraction of the core is the highest of the cavity structure, that of second cladding the lowest, and that of the first cladding between the two so that the first cladding becomes the core of the second cladding. In this manner, pump light coupled into the first cladding is confined within it as it propagates along the length of the cavity. As it does so, it is efficiently absorbed by the rare earth dopant in the core to create the population inversion necessary for lasing to amplifying action.

The laser diode array is a commercially available type having a collective output power of 15 watts, the sum of the outputs of a plurality of equally spaced stripes or emitting facets, each of which radiates over an NA of 0.6 along an azimuth measured perpendicular to the length of the emitting facet with an NA much smaller in a direction orthogonal thereto.

The output of each emitting facet is collected by a corresponding rectangular carrier fiber that is aligned within specified tolerances at the interfacet spacing by way of an alignment block with a series of complementary configured precisely shaped and spaced grooves formed in the block via photolithographic and preferential etching techniques.

The opposite ends of the rectangular carrier fibers are brought together as a rectangular stack, each one of which has an NA $\sim 0.2$.

The rectangular stack is imaged by a simple $3\times$ reduction lens so that its size is equal to or slightly smaller than the rectangular shape of the rectangular cladding of the fiber structure.

Each of the laser diode facets is imaged onto a corresponding rectangular carrier fiber with a coupling efficiency of 70 to 80% via a biaspheric cylindrical lens which matches the NA of the facet to that of the rectangular fiber, or nearly so, to make efficient use of the available pump energy.

The overall efficiency throughout of the system, accounting for all coupling losses and pump conversion efficiency, is approximately 40%.

To form the array of carrier fibers, a rectangular preform is first formed of soft glass, say BAK 5 for the core and BAK 2 for its cladding. This is surrounded by a circular support cladding comprising a material such as LAKN 12 having an etch rate that is many times greater than that of BAK 2 (e.g., a thousand). This structure is drawn down so that the size of the inner rectangle is of some specified intermediate size larger than its final size. The circular cladding is then etched away, leaving a spacing layer of a few microns or so on either side of the outer cladding. A number of these fibers are then stacked and again surrounded by a circular support cladding, and this structure, in turn, is drawn down until the rectangular stack takes on its final geometry. The rectangular carrier fibers are separated at the spacing layer interfaces at one end and are then placed in the individual grooves of the locating block.

The cylindrical biaspheric is a 16th order polynomial for sharp imaging, well-corrected for coma, and efficient NA matching between the laser array emitting facets and the rectangular carrier fibers.

The precision grooves are formed in the locating block by preferential etching along crystallographic axes which will yield well-defined rectangular shapes that are periodic with the laser array emitting facets.

BRIEF DESCRIPTION OF THE DRAWINGS

The principles of the present invention may be clearly understood by considering the following description in conjunction with the drawings wherein like reference characters identify like parts and wherein:

FIG. 1 is a diagrammatic perspective view of a laser embodying features of the invention;

FIG. 2 is an enlarged diagrammatic perspective showing a detailed view of the output end of a fiber cavity in FIG. 1;

FIG. 3 is an enlarged diagrammatic vertical elevational view of the ends of stacked fiber waveguides or carrier fibers in FIG. 1;

DETAILED DESCRIPTION OF PREFERRED EMBODIMENTS

Figure 4:
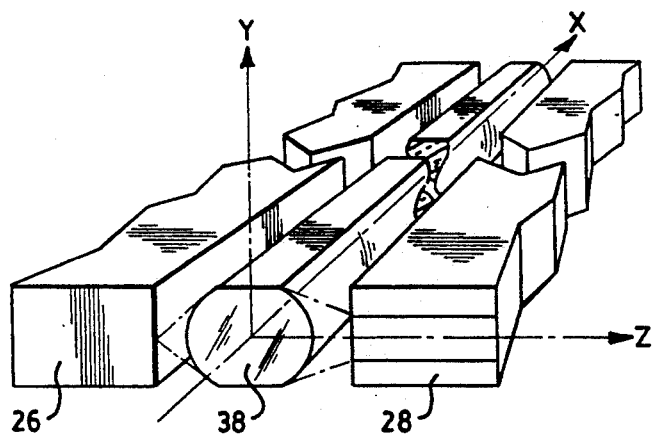
FIG. 4 is an enlarged diagrammatic and broken perspective view of part of the geometric coupling arrangement for coupling the output from light sources with the ends of fiber waveguides or carrier fibers.

FIG. 1 illustrates an embodiment of the single mode fiber laser of the invention where it is designated at 10. Laser 10 produces an output of 5 watts over a numerical aperture (NA) approximating 0.15 at a wavelength $\lambda = 1.06\mu$ thus making it particularly suitable for printing applications requiring high power. While a specific numerical aperture appears for this embodiment, the NA may be anywhere in the range of, for example, 0.1 to 0.2. In laser 10, a laser cavity 12 includes an optical fiber 14 and a partially-reflective output mirror 15 that by reflection feeds back part of the energy striking it. A high power laser light source 16 to 15 Watts more or less in the form an aligned row of a plurality of emitting facets comprising a laser diode array 18 (or laser diode bar) one cm wide, for example. The number of cavities in array 18 may be, for example, anywhere between 10 and 40. When desired, they may also be modulatable. The diode cavities together emit 15 or more Watts of light at 807 nm $\pm 5$ nm. A geometric coupling system 20 collects energy from the laser diode array 18 and introduces it into the laser cavity 12 for purposes of pumping it to produce lasing action.

The optical fiber 14 of cavity 12 includes a single mode core 21, preferably $5\mu$, a first cladding 22, and a second or outer cladding 24. The single mode core 21 is doped with a lasing species such as a rare earth, for example with neodymium $Nd^{3\pm}$ ions, present in concentrations up to of $\frac{1}{2}$ weight percent or lower, but preferably around $\frac{1}{3}$ weight percent. Other embodiments of the invention use other suitable dopants such as Yb or Yb+Er.

FIG. 2 illustrates the optical fiber 14 in more detail. The figure shows the first cladding 22 surrounding the core 21 and having a vertically rectangular cross-section such as $300\mu \times 80\mu$. In other embodiments of the invention, the cross-section may have other shapes, such as elongated or other geometries which make efficient use of pumping power. In general, the maximum dimension of the cross-section of the cladding 22 is larger than that of the corresponding dimension of array 18. The second or outer cladding 24, preferably made of a low index fluorinated polymer, surrounds rectangular first cladding 22. In the fiber 14 of the cavity structure 12, the core 21 has the highest index of refraction, the second outer cladding 24 has the lowest, and the first cladding 22 is of intermediate value. Hence the first cladding 22 acts as the core of the second cladding 24.

As a result, the second cladding 24 confines pump light coupled into the first cladding 22 within the first cladding so that as the pump light propagates along the length of the fiber 14 in cavity 12. As the propagating confined light travels the length of the cavity 12, it intersects the core 21 many times throughout the core's length and efficiently absorbs the pump light, while the first cladding 22 confines it, to create the population inversion necessary for lasing action and/or amplification. Details of the operation of a cavity such as 12 with a fiber such as 14 appear in U.S. Pat. No. 4,815,079, assigned to the same assignee as the present application. In one embodiment, the fiber laser cavity is a 5 Watt single mode source with $\lambda = 1.06$, NA $\sim 0.15$, and an efficiency of 60%. Other embodiments use values such as NA from 0.1 to 0.2 and efficiencies of 50% and higher.

The laser diode array 18 of the light source 16 is of the type that is commercially available and emits a collective power output of 15 watts from the output of, for example, 33 equally spaced diodes or emitting facets 26. Each facet 26 radiates over a numerical aperture of 0.45 to 0.65 and preferably, in this embodiment, 0.6 along an azimuth measured perpendicular to the length of the emitting facet, and over a numerical aperture much smaller in a direction orthogonal thereto.

The coupler 20 includes flat rectangular fiber waveguides or carrier fibers 28 equal in number to the laser emitting facets 26 and having respective numerical apertures of 0.2 in the planes transverse to the widths of the entrance ends facing the laser diode facets 26. The fibers 28 each receive the outputs of corresponding ones of each of the emitting facets 26 via an optical system including a cylindrical "biaspheric" lens 38. An alignment block 30 holds the fibers 28 flat and aligns each fiber within specified tolerances at the laser diode interfacet spacing. The alignment block 30 holds the entrance ends of the respective flat fibers 28 within a series of complementarily configured precisely shaped and spaced grooves 32 formed in the block. The entrance ends of the fibers 28 thus arranged efficiently capture the light from the diode laser facets.

The opposite or output ends 33 of the rectangular fibers 28 merge into a rectangular stack 34 in which each fiber end 33 has a numerical aperture of 0.2. This arrangement concentrates and transforms the widely distributed light of the laser bar 18 in one dimension into the stack 34 in two dimensions. FIG. 3 illustrates an end view of the merged rectangular stack 34. A 3× reduction lens 36, which can be a singlet or more complex multi-element form, images the rectangular stack 34 to a size equal to or slightly smaller than the rectangular shape of the first cladding 22. The rectangular stack 34 has dimensions, for example, of 160μ by 825μ. The dimensions of the end of cladding 22 are 80μ×300μ.

The 3× demagnification images a 53.3μ×275μ replica of the stack 34 on the 80μ ×300μ cladding 22. This allows imaging of virtually all the light from the stack 34 onto a large proportion of the end of the cladding 22, while allowing some tolerances in the spacing and alignment. The input facet of the cladding 22 captures virtually all of the pump light.

FIG. 4 is an enlarged diagrammatic and broken perspective view showing the coupling of the output from the facets 26 to the entrance ends of fiber waveguides 28. Here, the lens 38 has a longitudinal axis arranged along the x-axis of an orthogonal coordinate set of axes x, y, and z. The emitting facets 26 of array 18 lie in a plane parallel to the x-y plane, and the y-z plane is perpendicular to the x-axis of the lens 38. As shown in FIG. 4, the "biaspheric" cylindrical lens 38 images each of the laser diode facets 26 onto a corresponding carrier fiber 28. The cylindrical lens 38 has two "aspheric" surfaces I and II. These serve to sharply image the facets 26 on the ends of the fibers 28 and efficiently match the numerical apertures of laser array emitting facets 26 with those of carrier fibers 28 at least in the y-z plane. The term "biaspheric" is used in the limited sense of describing a cylindrical lens with two surfaces whose cross sectional shapes in the y-z plane define curves other than conic sections. Each "aspheric" surface serves to limit various on-axis and off-axis aberrations.

The lens 38 focuses the light from the fibers in azimuths in planes parallel to the y-z plane as shown in FIG. 4. In such planes, the lens 38 matches the numerical aperture of each facet 26 to that of the corresponding rectangular fiber 28, or nearly so, to make optimal use of the available pump energy.

On the other hand, the lens 38 has no power in the lateral x-z plane as shown in FIG. 4. Nevertheless, each wide fiber 28 captures the lateral divergence of the corresponding laser diode because the beam divergence of the emitting facets 26 is comparatively much narrower in the lateral than the transverse direction.

The lens 38 focuses and magnifies rather than collimates. That is, the light in the space between the lens 38 and the fibers 28 is not collimated. The magnification and focusing preserves the brightness of the light, neglecting internal losses, while relaxing alignment precision and tolerances on the thickness of the fibers 28. The non-collimating lens 38 permits use of fibers 28 that are thinner in the transverse direction of the lens and hence results in a smaller stack 34 than would be possible with a collimating lens. A collimating lens would require wider fibers 28 to capture the axially transverse divergences of the diode facets 24. As a result flatter fibers are used and these bend more easily than thicker ones thus helping in the process of fitting the fibers 28 in position.

Details of the aspheric surfaces of the lens 38 are described in the concurrently filed application of S. Fantone, entitled "Cylindrical Fiber Coupling Lens with Biaspheric Surfaces and Fabrication Method Therefor". According to that application the first and second surfaces have the following curvatures:

$$z(y) = \frac{cy^2}{1 + [1 - (1 + K)c^2y^2]^{\frac{1}{2}}} + Ay^4 + By^6 + Cy^8 + Dy^{10} + Ey^{12} + Fy^{14} + Gy^{16}$$

where
c is the curvature at the pole of the surface.

K is the conic constant

A, B, C, D, E, F, and G are the 4th, 6th, 8th, 10th, 12th, 14th, and 16th order deformation terms.

In the following table, a positive radius has its center of curvature to the right of the surface. A negative radius has its center of curvature to the left of the surface. A distance TH0 represents the axial distance from the laser diode ends to the first aspheric surface; a distance TH1 represents the axial thickness of the lens 38 along the z-axis; a distance TH2 represents the axial distance from the aspheric surface to the receiving ends of the carrier fiber 28; $R_1$ radius is the base radius of the first surface in the y-z plane; $R_2$ is the radius of the second surface; EFL is the effective focal length of the lens; the back focal length is BF; the transverse magnification is T-MAG; n is the refractive index of the material of the lens 10; and F/# is the F number of the lens 10; the reference object height is REF OBJ HT; the reference aperture height is REF AP HT; a positive radius has its center of curvature to the right of the surface, a negative radius has its center of curvature to the left of the surface;

TH0 = 0.071 mm
TH2 = 0.331 mm
TH1 = 0.098 mm
$R_1$ = 0.206 mm
$R_2$ = −0.087 mm
n = 1.830
EFL = 0.087 mm
BFL = 0.331 mm
T-MAG = −3.030 mm
F/# = 1.82
REF OBJ HT = 0.005 mm
REF AP HT = 0.059 mm
LENGTH = 0.500 mm

The aspheric polynomial data for coefficients in the aforementioned equation for the first surface are:

| | |
|---|---|
| K = −13.7971 | |
| A = −1.20030E + 02, | 4th order coefficient |
| B = 5.04869E + 04, | 6th order coefficient |
| C = −2.41203E + 07, | 8th order coefficient |
| D = 7.68848E + 09, | 10th order coefficient |
| E = −1.176771000E + 12, | 12th order coefficient |
| F = 8.924943727E + 13, | 14th order coefficient |
| G = −3.058562317E + 15, | 16th order coefficient |

The aspheric polynomial data for the second surface are:

| | |
|---|---|
| K = −1.83326 | |
| A = −1.38769E + 02, | 4th order coefficient |
| B = 1.05988E + 04, | 6th order coefficient |
| C = −7.64537E + 05, | 8th order coefficient |
| D = 2.06031E + 08 | 10th order coefficient |
| E = 1.205466504E + 11, | 12th order coefficient |
| F = 2.591516650E + 13, | 14th order coefficient |
| G = −1.553182640E + 15, | 16th order coefficient |

All of the above data is for a wavelength of 1.06 micrometers.

According to one embodiment of the invention, the transverse magnification of the lens 38 is the reciprocal or inverse of the reduction in magnification of the lens 36, namely a magnification of 3. This makes the overall magnification of the system unity. The numerical aperture matching and wide fiber arrangement brings the overall efficiency of the laser 10, in the azimuths transverse to the axis of the lens 38, through the cavity 12, and accounting for all coupling losses and pump conversion efficiency, to approximately 40 percent.

The lens 38 substantially matches the divergences of the laser diodes 26 in the y-z azimuth to the numerical apertures of the input ends of the fibers 28. Similarly, the lens 36 substantially conforms the numerical apertures of the output ends 33 of the fibers 38 in the stack 34 to the input facet of the cladding 22.

Figure 5:
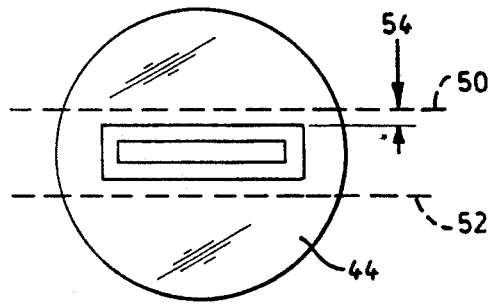
FIG. 5 is a diagrammatic detail of a section of a part of the device of FIG. 1 and is useful in understanding a step in the manufacture of part of a carrier fiber in FIG. 1.
Figure 6:
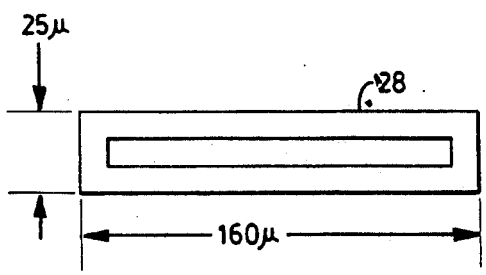
FIG. 6 is an enlarged elevational view of finished fiber waveguide or carrier fiber in FIG. 1.

One example of constructing the array of carrier fibers 28 involves first forming a rectangular preform of soft glass such as BAK 5 for the core of each fiber 28 and covering the BAK 5 with BAK 2 for the cladding. It then entails surrounding the BAK 5 and BAK 2 preform with a circular support material 44 composed of a material such as LAKN 12 having an etch rate many times greater than that of BAK 2, e.g., a thousand. The result appears in FIG. 5. The next step requires drawing the structure down to a size such that the inner rectangle is of some specified intermediate measurements larger than its final dimensions. The support material is then etched or ground away in a well-known manner at the dotted lines (50-52) in FIG. 5 to leave a spacing layer 54 of a few microns or so on either side of the outer BAK 2 cladding 44.

A number of the resulting fibers 28 are then stacked and fused together. The fused stack is surrounded with a circular cladding. The process continues by drawing down the stacked and surrounded structure until the rectangular stack 34 reaches its final geometry, for example of 160μ × 825μ, in which the dimensions of each of the rectangular carrier fibers 28 is 25μ × 160μ. The rectangular fibers 28 at one end of the stack are then separated into the individual rectangular 25μ × 160μ fibers 28 by dissolving the high etch-rate interconnecting material 44 at one end with a weak acid. This is followed by placing the fibers 28 in the individual grooves 32 of the alignment block 30.

The procedure for making the precision grooves 32 in the block 30 calls for forming the block and preferentially etching the grooves with well-known techniques along crystallographic axes. This yields well-defined rectangular shapes that are periodic with the laser array emitting facets 26.

In manufacturing the system, an assembler or assembling device moves the lens 38 with respect to the light sources 26 while a television camera inspects the resulting image. When the camera shows a good image, the assembler fixes the position of the lens. Thereafter, the assembler positions the block 30 of fibers. With the entire system in operation, the assembler goes back and forth to optimize the positions of the lens 28 and the block 30.

Figure 7:
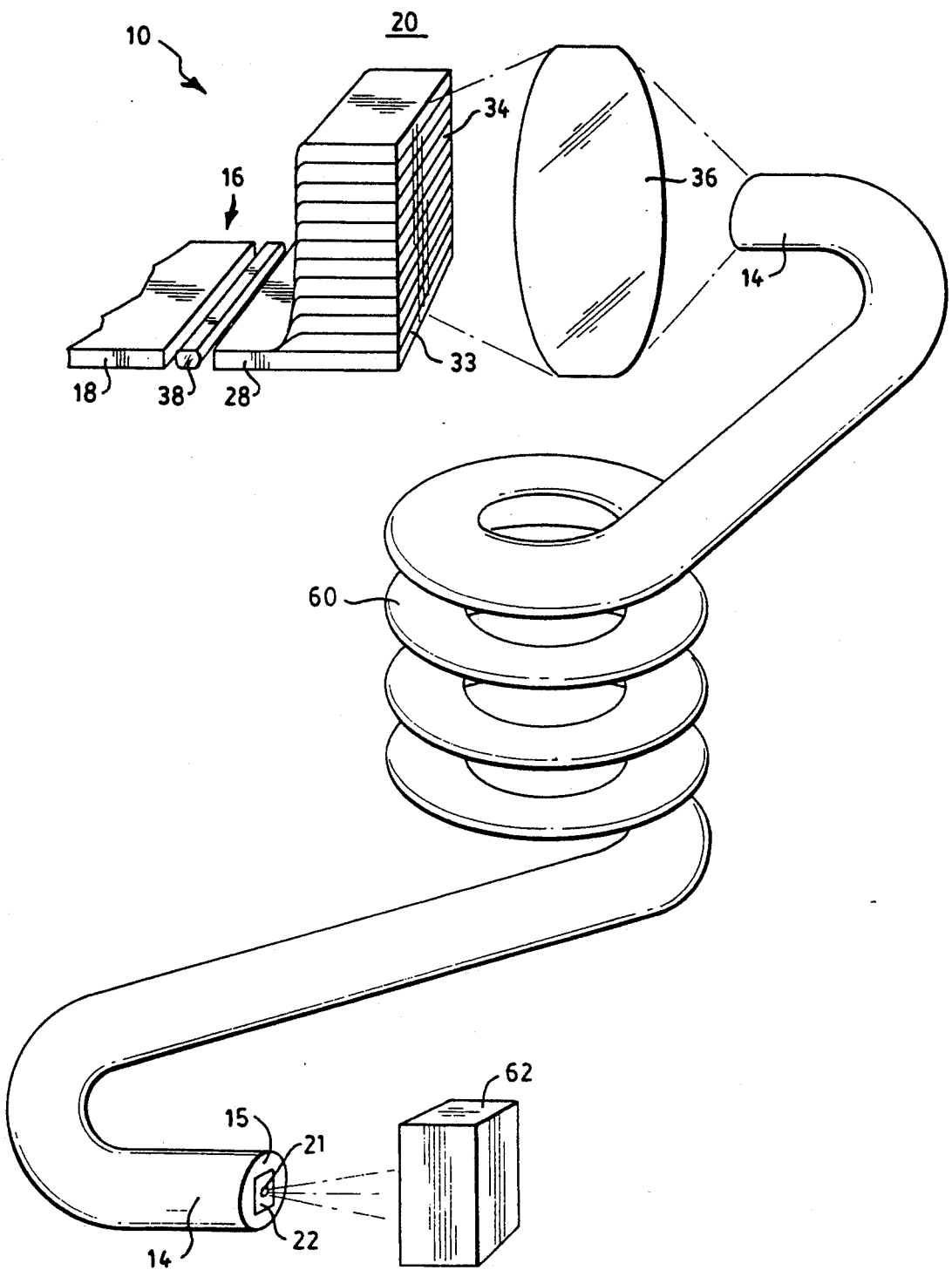
FIG. 7 is a diagrammatic and partially perspective view of another embodiment of the inventive laser.

Another embodiment of the invention appears in FIG. 7. Here the structure is identical to that in FIGS. 1 to 6, with the following exceptions:

The fiber laser cavity is a 5 Watt single mode source with λ=1.06, NA~0.12, and an efficieny of 50% or higher. The diode laser 18 has twelve laser diodes and the number of fibers 28 is also twelve. Each fiber 28 is 55μ thick with an NA 0.2, so that the stack 34 is 660μ high and 160μ wide with an NA 0.2. The 3X reduction lens 36 images the 660μ by 160μ stack 34 onto a 220μ by 53μ area on the 300μ by 80μ input facet of the first cladding 22. The core 21 is 8μ in diameter.

In FIG. 7, the cavity 14 is 30 meters long and is coiled into a coil 60. The small cross-section of the comparatively hard cladding 22 and the soft character of the polymer cladding 24 permit coiling of the long cavity into a coil of 5 to 7 centimeters. This makes for a compact structure.

As in the other figures, the lens 38 substantially conforms the divergences of the laser diodes 26 in one azimuth transverse to the z-axis of the lens to the numerical apertures of the input ends of the fibers 28. Similarly the lens 36 substantially matches the numerical apertures of the output ends 33 of the fibers 38 in the stack 34 to the input facet of the cladding 22.

To modulate the beam emerging from the core 21 at the mirror 15, an acoustic optic modulator or an electric optic modulator 62 refracts or diffracts the emerging beam as needed.

While embodiments of the invention have been described in detail, it will be evident to those skilled in the art that the invention may be otherwise embodied.

What is claimed is:

1. An optical coupling system comprising:
light source means for furnishing pumping light and having a plurality of aligned light emitting facets;
coupling means for coupling light emerging from said light emitting facets to an entrance facet less than 500µ high in a laser cavity, said coupling means including a plurality of optical fibers having respective input ends associated with said light emitting facets and a plurality of output ends, said output ends having a combined cross-sectional area of greater than the cross-sectional area of said entrance facet, said coupling means including a reduction lens for focusing light from the output ends of said optical fibers while imaging said plurality of output ends on or into said entrance facet; and
cylindrical lens means extending longitudinally between said aligned emitting facets and said input ends of said optical fibers for focusing light from said sources on or into said input ends, said cylindrical lens being arranged as a magnifying lens and for imaging light from said emitting facets in a direction transverse to the aligned sources and on or into the input ends of said optical fibers.

2. The system of claim 1 wherein said reduction lens and said cylindrical lens have substantially equal and opposite magnifications.

3. An optical coupling system comprising:
light source means for furnishing pumping light and having a plurality of aligned light emitting facets;
coupling means for coupling light from said light emitting facets to a solid state medium in a laser cavity and including a plurality of optical fibers having respective input ends associated with said light emitting facets and a plurality of output ends; and
cylindrical lens means extending longitudinally between said aligned emitting facets and said input ends of said optical fibers for focusing light from said light emitting facets on or into said input ends, said cylindrical lens including biaspheric refracting surfaces and having a longitudinal axis, said refracting surfaces having transverse cross-sections in one azimuth that are other than conic sections.

4. The system of claim 3 wherein said coupling means includes a lens between said output ends and the solid state medium for focusing light from the output ends on or into the medium.

5. The system of claim 3 wherein said coupling means includes alignment means for holding respective ones of said input ends longitudinally in alignment with respective ones of said sources.

6. The system of claim 3 wherein said output ends are arranged in a rectangular stacked array and said coupling means includes a reducing lens for focusing light from said output ends on or into the end of the medium.

7. The system of claim 3 wherein each of said input ends of said fibers has a face elongated parallel to the alignment of said light emitting facets.

8. The system of claim 3 wherein said cylindrical lens has a cylindrical axis parallel to the alignment of said light emitting facets; and
each of said input ends of said fibers has a face elongated parallel to said cylindrical axis.

9. The system of claim 8 wherein each of said light emitting facets has a face elongated parallel to said cylindrical axis.

10. The system of claim 3 wherein:
(a) said light emitting facets each have numerical apertures that are different in orthogonal planes;
(b) said input ends each have numerical apertures that are the same in orthogonal planes; and
(c) said cylindrical lens includes surfaces for matching the numerical apertures of said light emitting facets and the numerical apertures of said input ends to each other in one of said orthogonal planes.

11. The system of claim 4 wherein the end of the medium on which said reducing lens focuses light is rectangular, and said coupling means with said lens focuses light from said fibers substantially entirely within the end of the medium.

12. The system of claim 8 wherein each of said output ends has an elongated face, said elongated faces at the output end being stacked one over the other to form a rectangular array and wherein said coupling means includes a reducing lens for focusing light from the output ends onto an end of the medium.

13. The system of claim 12 wherein the end of the medium on which said reducing lens focuses the light is rectangular, and said coupling means with said lens focuses light from said fibers substantially entirely within the end of the medium.

14. An optical fiber laser comprising:
means forming a longitudinally extending laser cavity having a solid state medium, said cavity having an input end which surrounds said medium;
light source means for furnishing pumping light and having a plurality of aligned light emitting facets;
coupling means for coupling light from said light emitting facets to the medium and including a plurality of optical fibers having respective input ends associated with said light emitting facets and a plurality of output ends; and
cylindrical lens means extending longitudinally between said aligned light emitting facets and said input ends of said optical fibers for focusing light emerging from said light emitting facets onto or in said input ends, said cylindrical lens means including biaspheric refracting surfaces and having a longitudinal axis, said refracting surfaces having shapes, as measured transverse to said longitudinal axis, that are non-conic.

15. The laser of claim 14 wherein said coupling means includes a lens between said output ends and the solid state medium for coupling light from the output ends onto or in selected portions of said cavity input end.

16. The laser of claim 14 wherein said coupling means includes alignment means for holding respective ones of said input ends longitudinally in alignment with respective ones of said light emitting facets.

17. The laser of claim 14 wherein said output ends form a rectangular array and said coupling means include a reducing lens for focusing light from said output ends onto or in selected portions of said input end of the said cavity.

18. The laser of claim 14 wherein each of said input ends of said fibers has a face elongated parallel to the alignment of said light emitting facets.

19. The laser of claim 14 wherein:
 (a) said cylindrical lens has a cylindrical axis parallel to the alignment of the light emitting facets; and
 (b) each of said input ends of said fibers has a face elongated parallel to said cylindrical axis.

20. The laser of claim 17 wherein each of said light emitting facets has a face elongated parallel to said cylindrical axis.

21. The laser of claim 14 wherein:
 (a) said light emitting facets each has transverse and lateral numerical apertures;
 (b) said input ends each have transverse and lateral numerical apertures; and
 (c) said cylindrical lens includes surfaces for matching said transverse numerical apertures of said sources and the transverse numerical apertures of said input ends to each other at least along one azimuth.

22. The laser of claim 14 wherein said selected portion of the input end of said cavity is rectangular, and said coupling means with said lens focuses light from said fibers substantially entirely within said selected portion.

23. An optical coupling system, comprising:
 light source means for furnishing pumping light and having a plurality of aligned light sources;
 coupling means for coupling light from said light sources to an entrance facet less than 500μ in a laser cavity and including a plurality of optical fibers having respective input ends associated with said light sources and a plurality of output ends, said output ends having a combined cross-sectional area of greater than the cross-sectional area of said entrance facet;
 said coupling means including a reduction lens for demagnifying and focusing light from the output ends of said optical fibers on the entrance facet; and
 cylindrical lens means extending longitudinally between said aligned sources and said input ends of said optical fibers for focusing light from said sources onto said input ends;
 said cylindrical lens having surfaces for magnifying and imaging light from the sources in a direction transverse to the aligned sources onto the input ends of the optical fibers.

24. A device as in claim 23, wherein said reduction lens and said cylindrical lens have substantially equal and opposite magnifications.

* * * * *